United States Patent
Sakamoto

(10) Patent No.: US 11,486,426 B2
(45) Date of Patent: Nov. 1, 2022

(54) SNAP-FIT

(71) Applicant: FANUC CORPORATION, Yamanashi (JP)

(72) Inventor: Junichi Sakamoto, Yamanashi-ken (JP)

(73) Assignee: FANUC CORPORATION, Yamanashi (JP)

( * ) Notice: Subject to any disclaimer, the term of this patent is extended or adjusted under 35 U.S.C. 154(b) by 418 days.

(21) Appl. No.: 16/781,314

(22) Filed: Feb. 4, 2020

(65) Prior Publication Data

US 2020/0256362 A1   Aug. 13, 2020

(30) Foreign Application Priority Data

Feb. 7, 2019   (JP) .............................. JP2019-020499

(51) Int. Cl.
| | |
|---|---|
| *H05K 5/00* | (2006.01) |
| *F16B 5/06* | (2006.01) |
| *H05K 5/02* | (2006.01) |

(52) U.S. Cl.
CPC ......... *F16B 5/0607* (2013.01); *H05K 5/0017* (2013.01); *H05K 5/0021* (2013.01); *H05K 5/0204* (2013.01); *H05K 5/0208* (2013.01); *Y10T 403/59* (2015.01)

(58) Field of Classification Search
None
See application file for complete search history.

(56) References Cited

U.S. PATENT DOCUMENTS

| | | | | |
|---|---|---|---|---|
| 4,212,415 A | * | 7/1980 | Neely ..................... | B65D 83/06 222/231 |
| 5,383,098 A | * | 1/1995 | Ma ........................ | H04B 1/3833 361/752 |
| 6,992,901 B1 | * | 1/2006 | Hung .................... | H05K 9/0009 174/385 |
| 7,072,188 B2 | * | 7/2006 | Janisch ............... | B60R 16/0239 361/833 |
| 7,878,822 B2 | | 2/2011 | Korczynski et al. | |
| 8,045,337 B2 | * | 10/2011 | Morales .................. | E05B 77/34 361/801 |
| 11,287,097 B1 | * | 3/2022 | Gallardo Amaya ........................ | H01R 12/7029 |
| 2010/0015821 A1 | | 1/2010 | Hsu et al. | |

FOREIGN PATENT DOCUMENTS

| | | |
|---|---|---|
| JP | H0517211 U | 3/1993 |
| JP | 2001308555 A | 11/2001 |
| JP | 2002-106533 A | 4/2002 |
| JP | 2002227816 A | 8/2002 |

\* cited by examiner

*Primary Examiner* — Anthony Q Edwards
*Assistant Examiner* — Rashen E Morrison
(74) *Attorney, Agent, or Firm* — Robert P. Michal, Esq.; Carter, DeLuca & Farrell LLP

(57) ABSTRACT

In a snap-fit for attaching a second unit to a first unit, an engaging member provided on the second unit includes: a claw configured to restrict movement of the second unit relative the first unit in a removing direction; an elastic support configured to support the claw so as to be movable in a direction intersecting the removing direction and in a releasing direction in which the claw is released from the engagement with an engaged member provided on the first unit; and an operative part provided on the elastic support and configured to release an engagement of the engaging member with the engaged member. The operative part includes at least a portion that overlaps the claw with respect to the removing direction.

10 Claims, 6 Drawing Sheets

SNAP-FIT

CROSS-REFERENCE TO RELATED APPLICATION

This application is based upon and claims the benefit of priority from Japanese Patent Application No. 2019-020499 filed on Feb. 7, 2019, the contents of which are incorporated herein by reference.

BACKGROUND OF THE INVENTION

Field of the Invention

The present invention relates to a snap-fit.

Description of the Related Art

Snap fitting is a technique for jointing two members together as disclosed in Japanese Laid-Open Patent Publication No. 2002-106533.

SUMMARY OF THE INVENTION

A snap-fit allows two members to easily engage each other. However, it is difficult to release the engagement in some snap fitting structures. For example, the snap-fit disclosed in Japanese Laid-Open Patent Publication No. 2002-106533 must be broken or deformed in order to release the engagement. Once a snap-fit has been broken, it cannot be reused, of course. Further, even when a snap-fit is released from the connection state by deforming the snap-fit, it may take time and effort to deform the snap-fit. That is, for example, such a deformation requires a strong force.

It is therefore an object of the present invention to provide a snap-fit that ensures ease of operation for releasing the snap-fit from the engagement state.

One aspect of the present invention resides in a snap-fit for attaching a second unit to a first unit by engaging an engaged member provided on the first unit with an engaging member provided on the second unit. In the snap-fit, the engaging member includes: a claw configured to restrict movement of the second unit relative to the first unit in a removing direction; an elastic support configured to support the claw so as to be movable in a direction intersecting the removing direction and in a releasing direction in which the claw is released from an engagement with the engaged member; and an operative part provided on the elastic support and configured to release an engagement of the engaging member with the engaged member, wherein the operative part includes at least a portion that overlaps the claw with respect to the removing direction.

The present invention provides a snap-fit that ensures ease of operation for releasing the snap-fit from the engagement.

The above and other objects, features, and advantages of the present invention will become more apparent from the following description when taken in conjunction with the accompanying drawings in which a preferred embodiment of the present invention is shown by way of illustrative example.

DESCRIPTION OF THE PREFERRED EMBODIMENTS

The present invention will be detailed below by describing a preferred embodiment with reference to the accompanying drawings. Herein, the directions described below follow the arrows shown in each drawing.

Embodiment

Figure 1A:
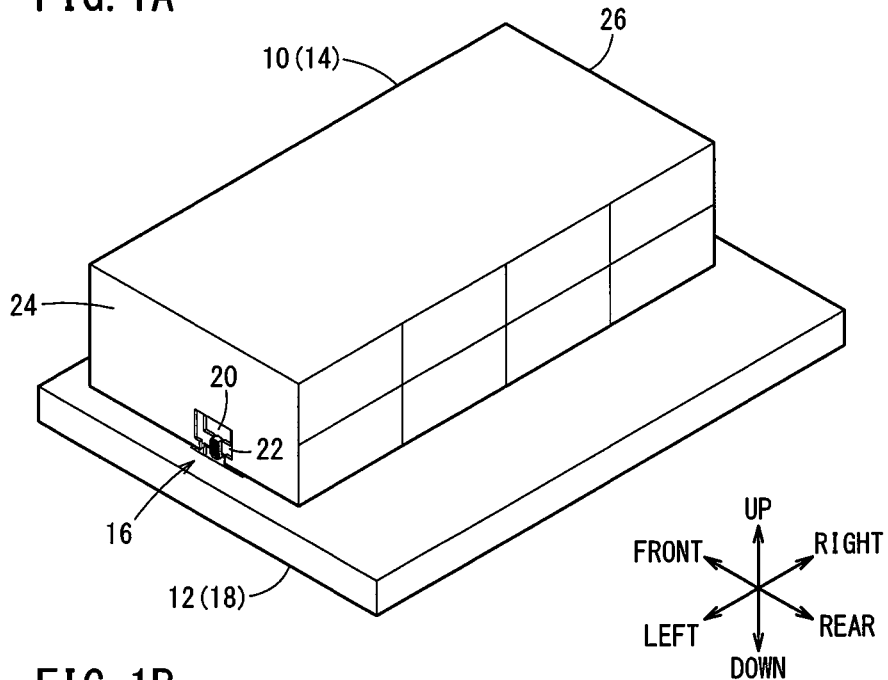
FIG. 1A is a perspective view of a controller and a display unit according to an embodiment.
Figure 1B:
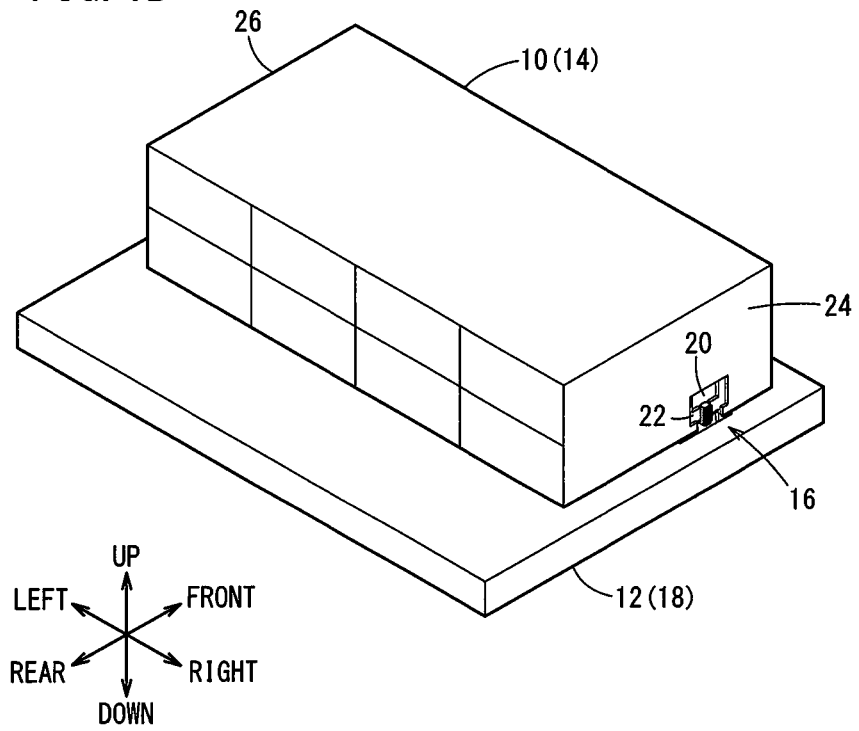
FIG. 1B is a perspective view of the same as viewed from a viewpoint different from that of FIG. 1A.
Figure 2:
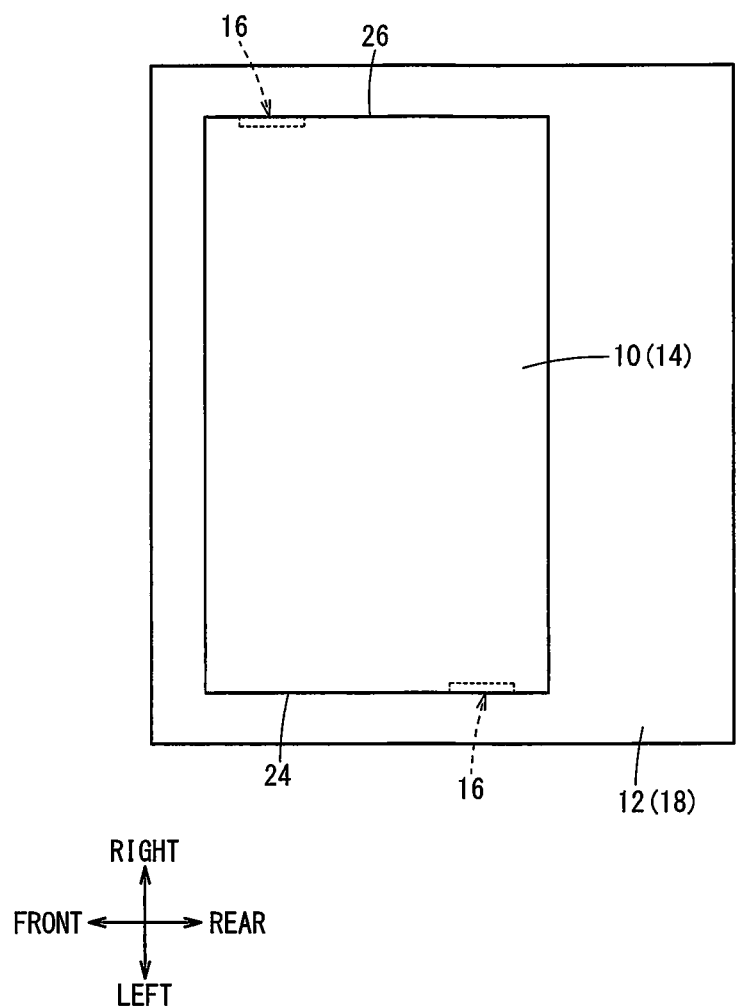
FIG. 2 is a top view of the controller and the display unit according to the embodiment.

FIG. 1A is a perspective view of a controller 10 and a display unit 12 in an embodiment. FIG. 1B is a perspective view thereof as viewed from a different viewpoint from that of FIG. 1A. FIG. 2 is a top view of the controller 10 and the display unit 12 in the embodiment.

The controller 10 is, for example, a numerical controller having a calculating function. The controller 10 in the present embodiment has a housing 14 (second unit) that accommodates a circuit board or the like with electric circuitry formed thereon. The controller 10 is attached to a chassis 18 (first unit) of a display unit 12 having a display screen (not shown) by a snap-fit 16 according to the present embodiment.

The snap-fit 16 is composed of an engaging member 20 provided on the housing 14 of the controller 10 and an engaged member 22 provided on the chassis 18 of the display unit 12 and configured to be engaged with the engaging member 20. It should be noted that an engaging member 20 may be provided on the chassis 18 of the display unit 12 and an engaged member 22 may be provided on the housing 14 of the controller 10.

In this embodiment, one engaging member 20 is provided on each of first and second faces 24 and 26 of the housing 14 of the controller 10 while two engaged members 22 are provided on the chassis 18 of the display unit 12 so as to correspond respectively to the locations of the engaging members 20 on the housing 14 of the controller 10. Here, the number of the engaging members 20 formed on each of the first and second faces 24 and 26 may be two or more.

In the present embodiment, as shown in FIG. 2, the engaging members 20 are arranged such that the snap-fit 16 on the first face 24 and the snap-fit 16 on the second face 26 are positioned as being shifted from each other in the front-rear direction (arrangement direction). This configuration makes it easy for the operator to recognize and check the correct orientation when attaching the housing 14 of the controller 10 to the chassis 18 of the display unit 12. As a result, the operator can attach the housing 14 of the controller 10 to the chassis 18 of the display unit 12 easily. In some cases, the engaging member 20 provided on the first face 24 and the engaging member 20 provided on the second face 26 may be positioned so that the engaging members 20 are not shifted from each other.

Now, the snap-fit 16 of the present embodiment will be further described. For the sake of simplicity, description will be given of the engaging member 20 arranged on the first face 24 of the housing 14 of the controller 10 and the engaged member 22 corresponding to the aforementioned engaging member 20 in FIGS. 1A and 1B. It is noted that the description may apply to those on the second face 26 similarly if the orientations, i.e., the front, rear, left and right directions, are reversed.

Figure 3:
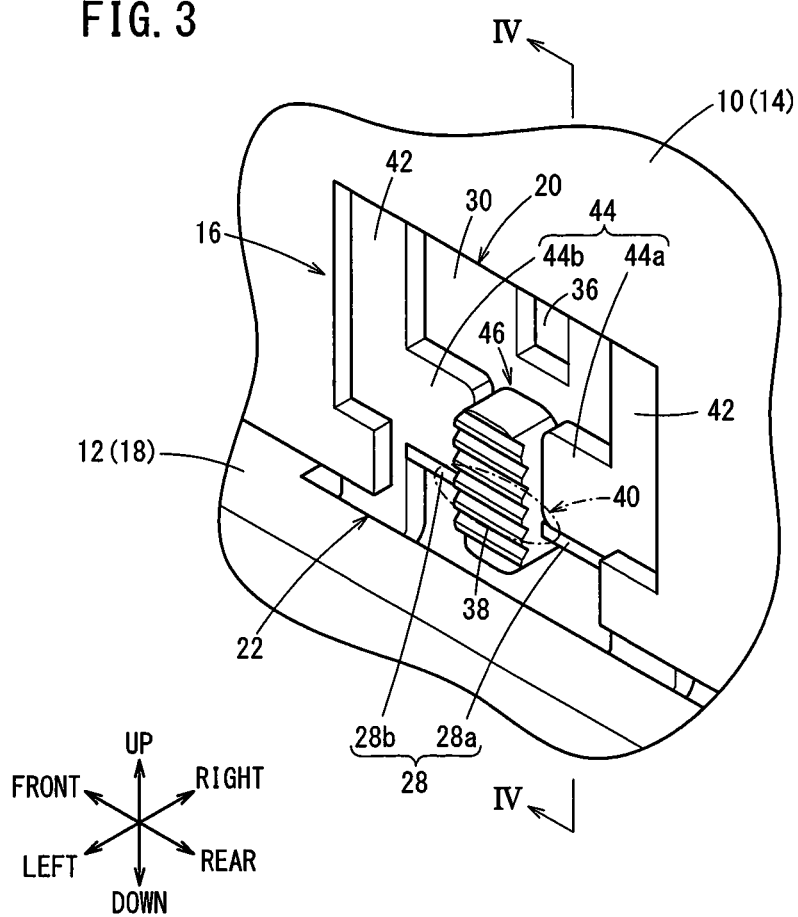
FIG. 3 is a perspective view (state 1) of a snap-fit according to the embodiment.
Figure 4:
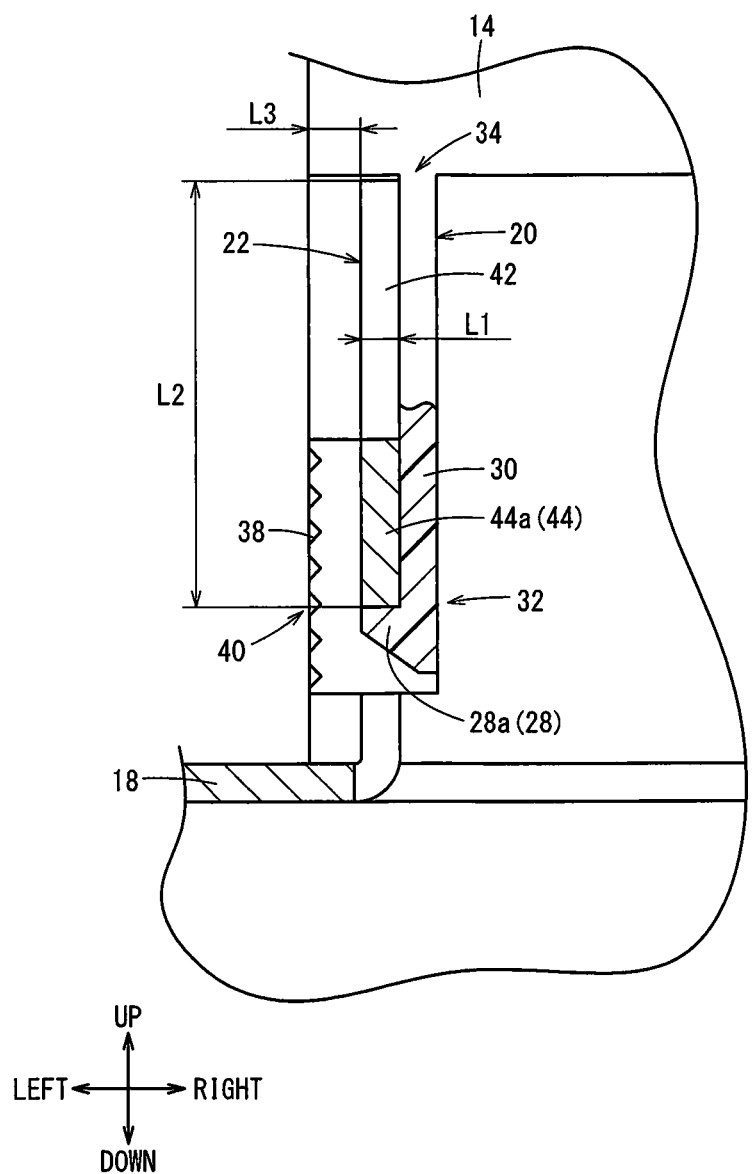
FIG. 4 is a sectional view taken along a line IV-IV of FIG. 3.
Figure 5:
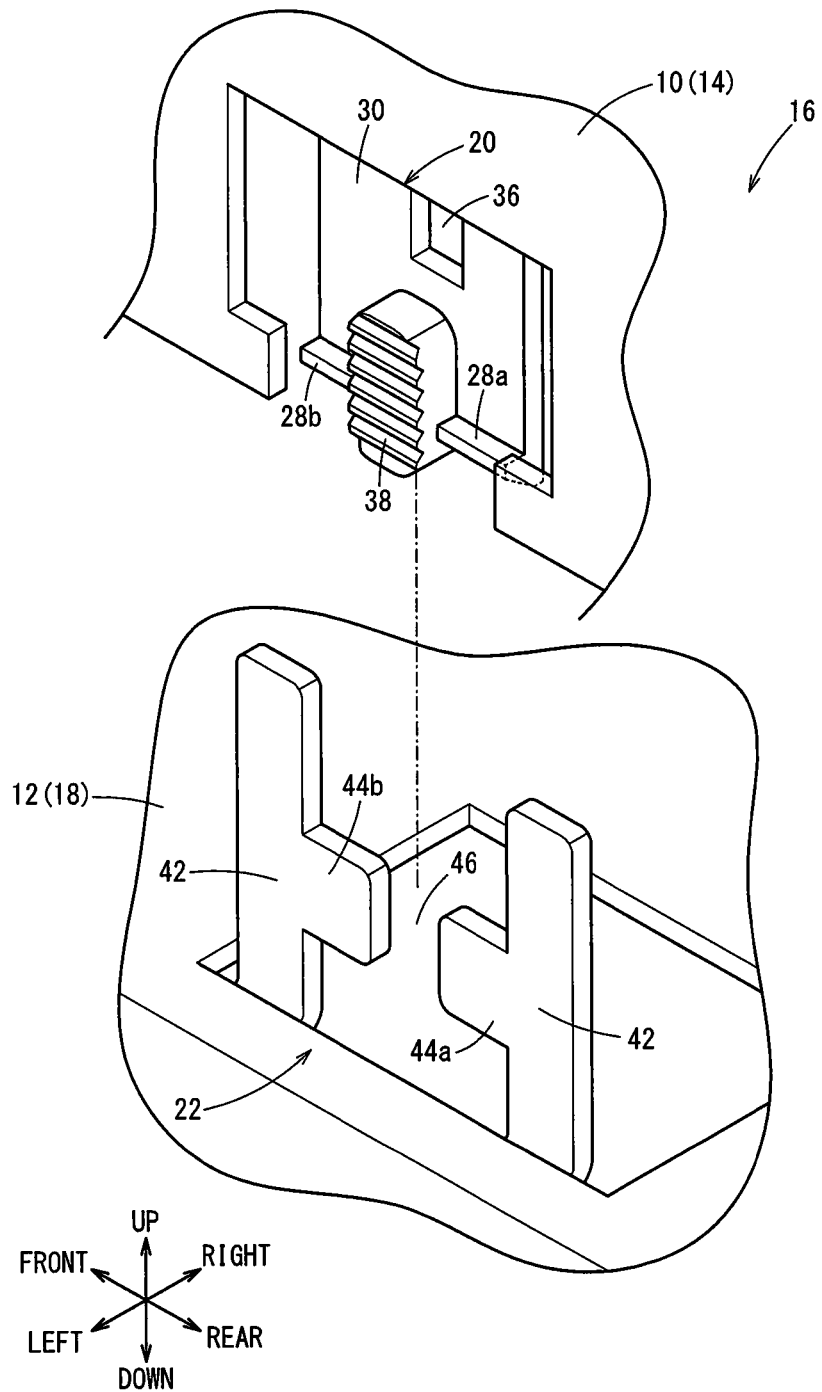
FIG. 5 is a perspective view (state 2) of the snap-fit according to the embodiment.

FIG. 3 is a perspective view (state 1) of the snap-fit 16 according to the embodiment. FIG. 4 is a sectional view taken along a line IV-IV of FIG. 3. FIG. 5 is a perspective view (state 2) of the snap-fit 16 of the embodiment. FIG. 5 shows a state in which the housing 14 of the controller 10 and the chassis 18 of the display unit 12 are released from the engagement state.

The engaging member 20 has two claws 28 (a first claw 28a and a second claw 28b) that restrain the housing 14 of the controller 10 from moving upward or in the direction in which it is removed from the chassis 18 of the display unit 12. Further, the engaging member 20 has an elastic support 30 provided on the housing 14 of the controller 10 to support the first and second claws 28a, 28b.

The first and second claws 28a, 28b are arranged apart from each other. Further, the first and second claws 28a, 28b are configured so as to be symmetrical to each other in planar view, i.e., when the snap-fit 16 is viewed from the left in the drawings. Accordingly, the first and second claws 28a, 28b have the same length in the front-rear direction, and have the same length in the left-right direction. Hereinafter, the length of the claw 28 in the left-right direction is also referred to as "first length L1" (see FIG. 4). In addition, when it is not necessary to distinguish the first claw 28a and the second claw 28b, the two both will be simply referred to as "claw 28".

The elastic support 30 is an elastic member that extends from the housing 14 of the controller 10 toward the chassis 18 of the display unit 12 (downward) and has a length L2. The elastic support 30 having elasticity can easily bend rightward when a rightward force F (see FIG. 6) is applied thereto, and is hard to break even when it is bent. Thus, this elastic support 30 supports the claw 28 in such a manner as to be movable rightward, i.e., in a direction intersecting the removing direction of the housing 14 and in a releasing direction in which the claw is released from the engagement with the engaged member 22. In the present embodiment, a distal end 32 of the elastic support 30 supports the claw 28, but the claw 28 may be supported by a portion other than the distal end 32 of the elastic support 30.

The elastic support 30 has a cutout portion 36 formed extending a predetermined length downward from a base 34 (see FIGS. 4 and 6) of the elastic support 30. Provision of the cutout portion 36 makes the elastic support 30 bend more easily. The shape of the cutout portion 36 including "the predetermined length" may be changed as appropriate. In some cases, the elastic support 30 may have no cutout portion 36.

The elastic support 30 is provided with an operative part 38 of the snap-fit 16. The operative part 38 has a predetermined thickness with respect to the left-right direction. The operative part 38 is provided between the two claws 28. Therefore, at least a portion 40 of the operative part 38 overlaps with the two claws 28 in the removing direction. In other words, the claws 28 and the portion 40 of the operative part 38 are located distant from the base 34 of the elastic support 30 by the length L2 in the removing direction. The portion 40 of the operative part 38 that overlaps with the claws 28 in the removing direction may be marked so that the operator can easily distinguish it.

The engaged member 22 is formed of two plate-shaped columns 42 extending upward from the chassis 18 of the display unit 12 and a pair of receiving portions 44 (a first receiving portion 44a and a second receiving portion 44b) extending from the respective columns 42 toward each other in the left-right direction. The first receiving portion 44a and the second receiving portion 44b have the same length with respect to the front-rear direction. Further, the first receiving portion 44a and the second receiving portion 44b are apart from each other with a vertical slit 46 formed therebetween. Hereinafter, when there is no need to distinguish between the first receiving portion 44a and the second receiving portion 44b, they will be simply referred to as "receiving portion 44".

The first claw 28a is hooked on the first receiving portion 44a. The second claw 28b is hooked on the second receiving portion 44b. The positional relationship between the claw 28 and the receiving portion 44 when the claw 28 is hooked on the receiving portion 44 is such that the claw 28 is on the lower side and the receiving portion 44 is on the upper side. Thus, the engaging member 20 and the engaged member 22 are in engagement with each other. In addition, movement of the housing 14 of the controller 10 in the removing direction from the chassis 18 of the display unit 12 is restricted by the claws 28. It should be noted that the shapes of the column 42 and the receiving portion 44 may be appropriately changed. Further, the engaged member 22 may have a recessed portion into which the claw 28 is fitted, instead of the receiving portion 44.

The first claw 28a and the second claw 28b of the embodiment are symmetrical to each other with the operative part 38 being interposed therebetween. The first receiving portion 44a and the second receiving portion 44b have the same length with respect to the front-rear direction. Therefore, in the present embodiment, when the claws 28 are hooked on the receiving portions 44, an approximately equal load is applied to the first claw 28a and the second claw 28b. Thus, the possibility of a large load being applied to only one of the two claws 28 is reduced, so that the risk of the claws 28 being damaged is reduced.

The operative part 38 is positioned in the slit 46 when the claws 28 of the engaging member 20 have become hooked on the receiving portions 44 of the engaged member 22. In this state, the operative part 38 having a predetermined thickness in the left-right direction is projected beyond the engaged member 22 leftward or in a direction opposite to the releasing direction by a second length L3 equal to or greater than the first length L1 ("second length L3" "first length L1").

Figure 6:
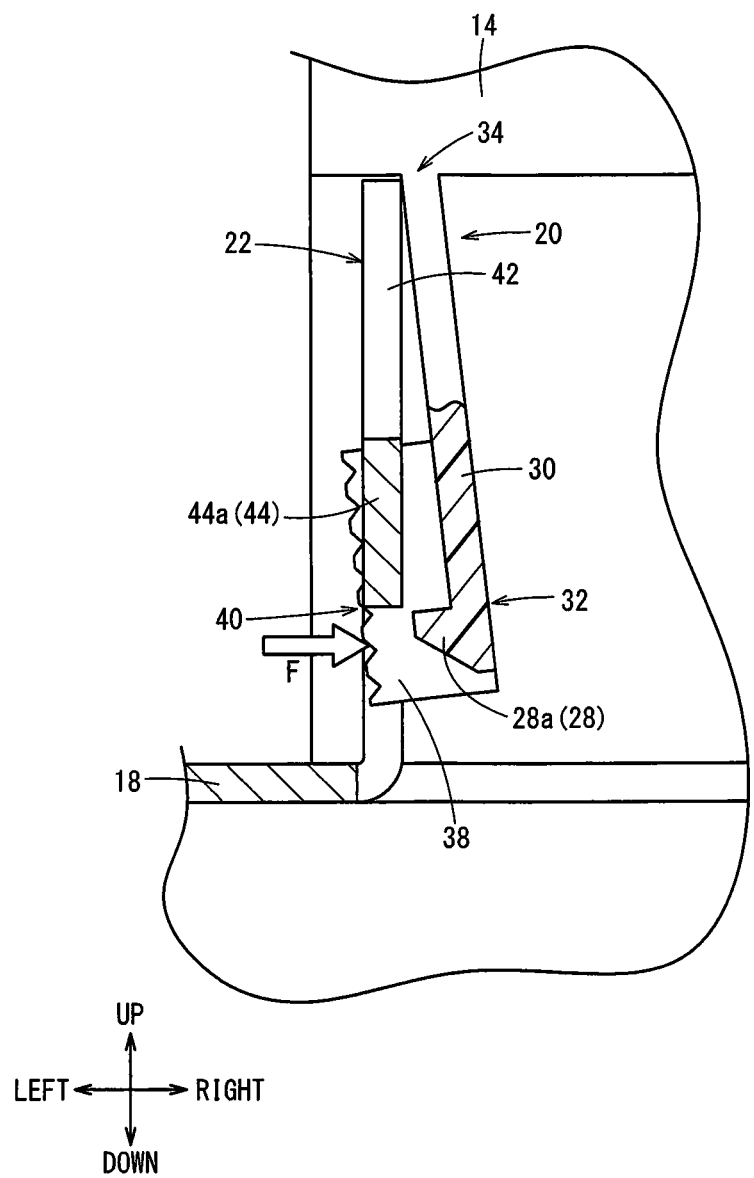
FIG. 6 is a sectional view of the snap-fit when an operative part of the embodiment is pressed, as taken along a line IV-IV of FIG. 3.

FIG. 6 is a sectional view of the snap-fit 16 when the operative part 38 of the embodiment is pressed, as taken along line IV-IV in FIG. 3.

The operator can push the operative part 38 from the left side. A rightward force F acts on the operative part 38 as it is being pressed from the left. As the rightward force F is applied to the operative part 38, the elastic support 30 bends rightward. As a result, the claws 28 supported by the elastic support 30 are disengaged from the receiving portions 44, and the engagement between the engaging member 20 and the engaged member 22 is released. Thus, in this embodiment, the engagement between the engaging member 20 and the engaged member 22 is easily released by applying the rightward force F to the operative part 38.

In addition, from a leverage viewpoint, the snap-fit 16 according to the present embodiment is configured such that the portion 40 (point of effort) of the operative part 38 is separated from the base 34 (fulcrum) of the elastic support 30 by the length L2, as with the claws 28. Therefore, it is easier to largely bend the elastic support 30 with a small force, as compared with the case where the operative part 38 is located closer to the base 34 of the elastic support 30 than the claws 28.

In addition, as described above, in the present embodiment, the operative part 38 projects leftward from the engaged member 22 by the second length L3. This enables the operator to easily push the portion 40 of the operative part 38 rightward by the second length L3 with his/her hand (finger) without using a special tool (for example, a dedicated jig). At this time, for example, the operator can press the portion 40 of the operative part 38 rightward by the second length L3 with such an intuitive operation as to push the operative part 38 until his/her finger pressing the operative part 38 touches the engaged member 22. The second length L3 is equal to or greater than the first length L1. Therefore, the operator can easily move the claws 28 rightward more than the first length L1 to release the engagement between the engaging member 20 and the engaged member 22.

By moving the housing 14 of the controller 10 in the removing direction under the condition in which the engagement between the engaging member 20 and the engaged member 22 is released, the housing 14 of the controller 10 is detached from the chassis 18 of the display unit 12, as shown in FIG. 5. When the housing 14 of the controller 10 is moved in the removing direction, the operative part 38 moves along the slit 46. Therefore, the movement of the operative part 38 in the removing direction is not hindered by the engaged member 22.

Modified Examples

Though the above embodiment has been described as one example of the present invention, it goes without saying that various modifications and improvements can be added to the above embodiment. It is also apparent from the scope of claims that the embodiment added with such modifications and improvements should be incorporated in the technical scope of the invention.

For example, in the embodiment, the first claw 28a and the second claw 28b are arranged symmetrical to each other with the operative part 38 interposed therebetween as viewed from the left side. However, the first claw 28a and the second claw 28b need not necessarily be symmetrical to each other with the operative part 38 interposed therebetween as viewed from the left side. In addition, corresponding to the first claw 28a and the second claw 28b, the first receiving portion 44a and the second receiving portion 44b need not necessarily be symmetrical to each other with the operative part 38 interposed therebetween as viewed from the left side. For example, the first claw 28a and the first receiving portion 44a may be made shorter in the front-rear direction than in the embodiment while the second claw 28b and the second receiving portion 44b may be made longer in the front-rear direction than in the embodiment.

Invention Obtained from the Embodiment

Inventions that can be grasped from the above embodiment and modified examples will be described below.

In the snap-fit (16) for attaching a second unit (14, 18) to a first unit (14, 18) by engaging an engaged member (22) provided on the first unit (14, 18) with an engaging member (20) provided on the second unit (14, 18), the engaging member (20) comprises: a claw (28) configured to restrict movement of the second unit (14, 18) relative to the first unit (14, 18) in a removing direction; an elastic support (30) configured to support the claw (28) so as to be movable in a direction intersecting the removing direction and in a releasing direction in which the claw is released from an engagement with the engaged member (22); and an operative part (38) provided on the elastic support (30) and configured to release an engagement of the engaging member (20) with the engaged member (22), wherein the operative part (38) includes at least a portion (40) that overlaps the claw (28) with respect to the removing direction.

This configuration provides a snap-fit (16) that ensures ease of operation for releasing the engagement.

The claw (28) may be supported by a distal end (32) of the elastic support (30). Thus, the claw (28) and the operative part (38) are arranged farthest from the base (34) (the second unit (14, 18)) of the elastic support (30) with respect to the removing direction. Therefore, a small force is sufficient enough to bend the elastic support (30)

The engaging member (20) may include two claws (28), the operative part (38) may be arranged such that the portion (40) is located between the two claws (28), and the engaged member (22) may be configured to engage with each of the two claws (28). This configuration can reduce the risk of an event that only one of the claws (28) is greatly separated from the engaged member (22) while the other is not separated enough from the engaged member (22).

The two claws (28) may be arranged so as to be symmetrical to each other with the operative part (38) interposed between the claws. This configuration makes it possible for load to act uniformly on the two claws (28) that hook the engaged member (22).

The engaged member (22) may include a slit (46) extending in the removing direction, and the operative part (38) may be located in the slit (46) when the engaging member (20) and the engaged member (22) engage with each other. This configuration reduces the risk that the engaged member (22) obstructs the movement of the operative part (38) in the releasing direction.

The operative part (38) may be configured to project beyond the engaged member (22) in a direction opposite to the releasing direction. This makes it possible to press the operative part (38) easily.

The claw (28) may have a first length (L1) extending along the releasing direction, and the operative part (38) may be configured to protrude beyond the engaged member (22) by a second length (L3) which is equal to or greater than the first length (L1), in the direction opposite to the releasing direction. This makes it easy for the operator to push the operative part (38) more than the first length (L1) along the releasing direction.

The second unit (14, 18) may include at least two engaging members (20) each having the operative part (38), and the first unit (14, 18) may include at least two engaged members (22) so as to correspond to the locations of the engaging members (20). This makes it possible to attach the second unit (14, 18) more firmly to the first unit (14, 18).

The second unit (14, 18) may have a first face (24) and a second face (26) facing each other at a distance therebetween, the first face (24) and the second face (26) each may include at least one of the engaging members (20), and the engaging member (20) provided on the first face (24) and the engaging member (20) provided on the second face (26) may be shifted from each other with respect to the arrangement direction intersecting the removing direction on the first face (24) and the second face (26). This makes it easy for the operator to recognize and check the correct mounting orientation of the first unit (14, 18) relative to the second unit (14, 18).

One of the first and second units (14, 18) may be a housing (14) of a controller (10), and the other may be a chassis (18) of a display unit (12). Thus, it is possible to easily attach the controller (10) to the display unit (12) and easily remove the controller (10) from the display unit (12).

What is claimed is:

1. A snap-fit for attaching a second unit to a first unit by engaging an engaged member provided on the first unit with an engaging member provided on the second unit, wherein the engaging member comprises:
    a claw configured to restrict movement of the second unit relative to the first unit in a removing direction;
    an elastic support configured to support the claw so as to be movable in a direction intersecting the removing direction and in a releasing direction in which the claw is released from an engagement with the engaged member; and
    an operative part provided on the elastic support and configured to release an engagement of the engaging member with the engaged member, wherein the operative part includes at least a portion that overlaps the claw with respect to the removing direction, the engaged member including a slit extending in the removing direction from a removing-direction end of the engaged member, and the operative part is located in the slit in a state where the engaging member and the engaged member are engaging with each other.

2. The snap-fit according to claim 1, wherein the claw is supported by a distal end of the elastic support.

3. The snap-fit according to claim 1, wherein:
    the claw of the engaging member comprises two claws;
    the operative part is arranged so that the portion is located between the two claws; and
    the engaged member is configured to engage with each of the two claws.

4. The snap-fit according to claim 3, wherein the two claws are arranged so as to be symmetrical to each other with the operative part interposed between the claws.

5. The snap-fit according to claim 1, wherein the operative part is configured to project beyond the engaged member in a direction opposite to the releasing direction.

6. The snap-fit according to claim 1, wherein one of the first and second units is a housing of a controller, and another unit thereof is a chassis of a display unit.

7. The snap-fit according to claim 1, wherein the operative part is accessible from a left-side of the engaging member such that the operative part is configured to be pushed from the left side in the releasing direction toward the engaged member to release the claw from the engaged member.

8. The snap-fit according to claim 1, wherein the engaged member includes:
    a pair of spaced-apart columns; and
    a pair of receiving portions extending laterally inward from the respective pair of space-apart columns and toward one another, the operative part being configured for receipt between the pair of receiving portions.

9. A snap-fit for attaching a second unit to a first unit by engaging an engaged member provided on the first unit with an engaging member provided on the second unit, wherein the engaging member comprises:
    a claw configured to restrict movement of the second unit relative to the first unit in a removing direction;
    an elastic support configured to support the claw so as to be movable in a direction intersecting the removing direction and in a releasing direction in which the claw is released from an engagement with the engaged member; and
    an operative part provided on the elastic support and configured to release an engagement of the engaging member with the engaged member, wherein the operative part includes at least a portion that overlaps the claw with respect to the removing direction, wherein:
    the claw has a first length extending along the releasing direction; and
    the operative part is configured to protrude beyond the engaged member by a second length which is equal to or greater than the first length, in the direction opposite to the releasing direction.

10. A snap-fit for attaching a second unit to a first unit by engaging an engaged member provided on the first unit with an engaging member provided on the second unit, wherein the engaging member comprises:
    a claw configured to restrict movement of the second unit relative to the first unit in a removing direction;
    an elastic support configured to support the claw so as to be movable in a direction intersecting the removing direction and in a releasing direction in which the claw is released from an engagement with the engaged member; and
    an operative part provided on the elastic support and configured to release an engagement of the engaging member with the engaged member, wherein the operative part includes at least a portion that overlaps the claw with respect to the removing direction, wherein:
    the engaging member of the second unit comprises at least two engaging members each having the operative part;
    the engaged member of the first unit comprises at least two engaged members so as to correspond to locations of the engaging members;
    the second unit has a first face and a second face facing each other at a distance therebetween;
    the first face and the second face each include at least one of the engaging members; and
    the engaging member provided on the first face and the engaging member provided on the second face are shifted from each other with respect to an arrangement direction intersecting the removing direction on the first face and the second face.

* * * * *